United States Patent [19]
Cook

[11] Patent Number: 5,649,189
[45] Date of Patent: Jul. 15, 1997

[54] METHOD AND APPARATUS FOR SINGLE PASS DATA ENCODING OF BINARY WORDS USING A STACK FOR WRITING IN REVERSE ORDER

[75] Inventor: John Cook, Southborough, Mass.

[73] Assignee: 3Com Corporation, Santa Clara, Calif.

[21] Appl. No.: 564,630

[22] Filed: Nov. 29, 1995

[51] Int. Cl.[6] .................................................. G06F 17/30
[52] U.S. Cl. ........................ 395/612; 395/101; 395/800; 395/898
[58] Field of Search ................................. 395/164, 612, 395/800, 101; 375/122; 340/347

[56] References Cited

U.S. PATENT DOCUMENTS

| 4,464,650 | 8/1984 | Eastman et al. | 340/347 |
|---|---|---|---|
| 5,027,376 | 6/1991 | Friedman et al. | 375/122 |
| 5,375,204 | 12/1994 | Motoyama et al. | 395/164 |
| 5,524,253 | 6/1996 | Pham et al. | 395/800 |
| 5,548,687 | 8/1996 | Motoyama | 395/101 |
| 5,553,283 | 9/1996 | Kaplan et al. | 395/612 |

*Primary Examiner*—Thomas G. Black
*Assistant Examiner*—Charles Rones
*Attorney, Agent, or Firm*—McGlew and Tuttle

[57] ABSTRACT

The method and system involves encoding each data value into a binary format and writing values in reverse order by first writing the value data portion, starting at its end, and proceeding towards its beginning and noting a starting index, upon starting the step of writing and noting an ending index upon ending the step of writing. Encoding includes using a stack wherein data values are pushed on the stack and read off the stack using a first in last out procedure. The start of a structured data type (set or sequence), namely the first byte of the value is encoded and/or written last and the end of a structured data type is the last byte and is encoded and/or written first. The length of the data portion is determined based on the starting and ending index. The length is then encoded to form part of the encoding.

19 Claims, 3 Drawing Sheets

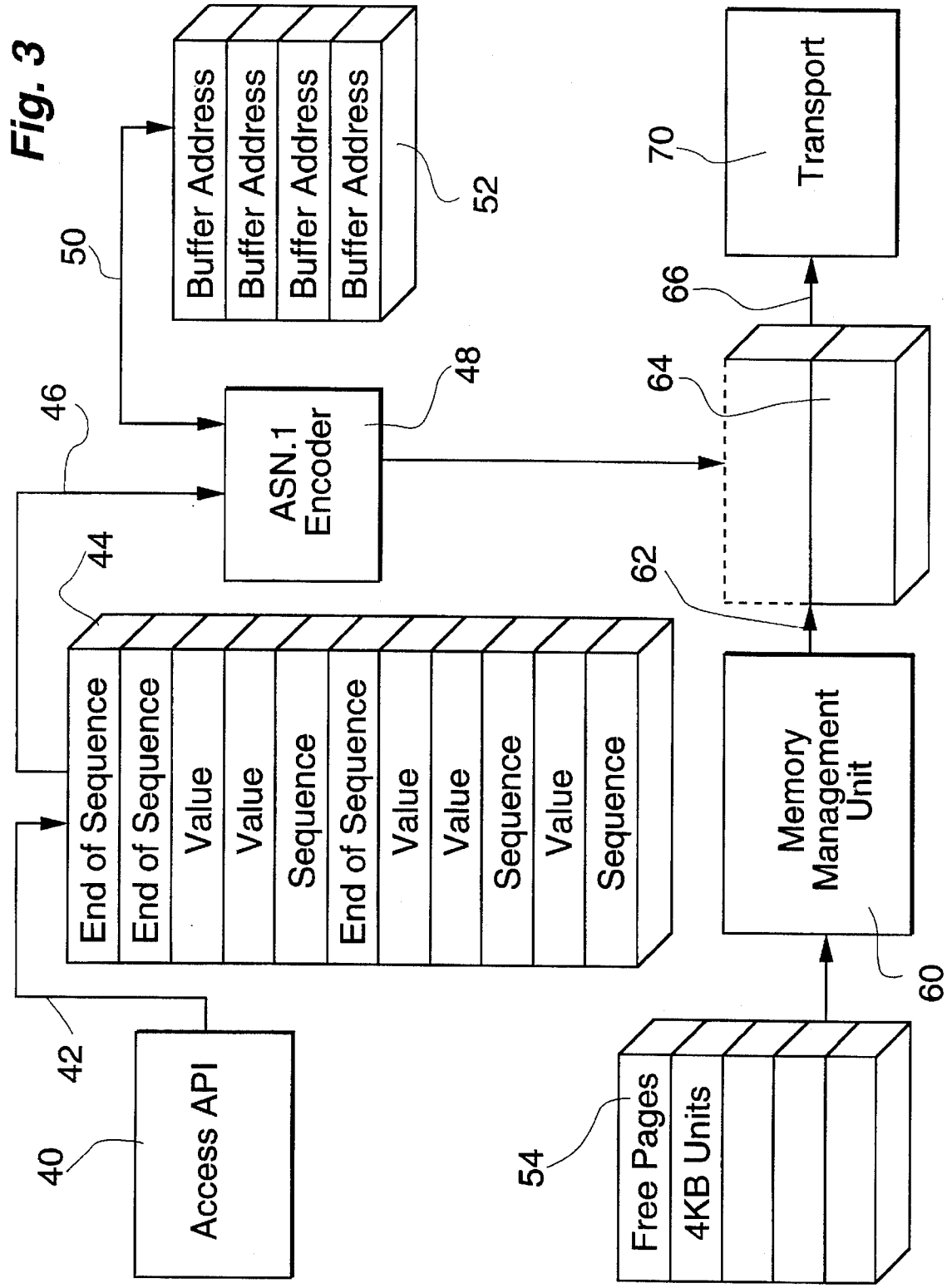

5,649,189

METHOD AND APPARATUS FOR SINGLE PASS DATA ENCODING OF BINARY WORDS USING A STACK FOR WRITING IN REVERSE ORDER

FIELD OF THE INVENTION

The present invention relates generally to encoding data and more particularly to encoding a set of datum according to the BER (Basic Encoding Rules) of the Abstract Syntax Notation 1 (ASN.1) as defined by ISO 8824 (International Standards Organization) and CCITT X.208.

BACKGROUND OF THE INVENTION

Data compression systems are known in the prior art that encode a stream of digital data signals into compressed digital code signals. The compressed signals may then be decoded back into the original data. Such a compression system is used to effect a savings in the amount of memory required to hold the data or the amount of time required to transmit a given body of digital information. ISO 8824:1990 and ISO 8825:1990 are each incorporated herein by reference.

In the BER encoding method of ASN.1, each data value consists of a type, a length and a value. The purpose of the BER encoding is to compress the data into the smallest number of bytes for transport across relatively slow communications mediums. Although three methods are described in BER for encoding the length information, one of the methods provides the tightest packet. Since some ASN.1 data types such as SEQUENCE and SET can contain many other values, the algorithm for encoding must look ahead to calculate the length of a composite data value. This is necessary as the appropriate number of bytes must be reserved in the data buffer to encode the length.

Data compression is especially important with regard to local area networks in that network management protocols are implemented which require compression for transport across the relatively slow communications media. In the past, the process of encoding ASN.1 protocol data units (PDUs) required two passes. The first pass calculates the length of various data values. During the second pass the actual data values are laid out into a data buffer as an encoded stream of bytes. This presents a difficult way to encode the data particularly when compiling a library of simple network management protocol (SNMP) encoding and decoding routines.

U.S. Pat. No. 5,375,204 to Motoyama et al discloses a system and method for efficient binary encoding which avoids a two pass encoding. According to the Motoyama et al system and method memory locations are reserved in the temporary storage buffer for storing the length of the procedure. The procedure is converted to binary format which is then appended to the end of the buffer after the space reserved for the length of the procedure. Procedures may be nested within procedures and space is reserved in the buffer for length information and binary representation of the nest of procedures, appended onto the end of the buffer. When a procedure ends, the length of the procedure is calculated and written into the space previously reserved for length information. This provides a memory buffer which can be considered a logically contiguous memory buffer.

Although the Motoyama et al system could be used in the compression of data for simple network management protocol encoding and decoding routines, the optimum encoding length is achieved by using the compressed length notation. This is the preferred method for encoding length in the SNMP subset of BER.

SUMMARY AND OBJECT OF THE INVENTION

It is an object of the invention to provide a compression system and method which allows for the optimum encoding of length using the compressed length notation to compress the data into the smallest number of bytes for transport across relatively slow communications mediums while avoiding the need for two passes to encode ANS.1 protocol data units (PDUs).

According to the invention, a system and method are provided for encoding data, particularly for SNMP encoding and decoding routines. A set of datum must be encoded according to the basic encoding rules of the Abstract Syntax Notion 1 as defined by ISO 8824 and CCITT X.208.

The invention provides a method for encoding data values wherein each value has a data type portion, a length portion and a data portion. The data portion may itself include another value (nested within the first value, itself including a data type portion, a length portion and data). The method comprises the steps of encoding each data value into a binary format and writing values in reverse order by first writing the value data portion, starting at its end, and proceeding towards its beginning and noting a starting index, upon starting the step of writing and noting an ending index upon ending the step of writing. The length of the data portion is determined based on the starting and ending index. The length is then encoded to form part of the encoding.

Preferably the step of encoding includes using a stack wherein data values are pushed on the stack and read off the stack using a first in last out procedure. In this way, the start of a structured data type (set or sequence) is the first byte and is encoded and/or written last and the end of a structured data type is the last byte and is encoded and/or written first. In this way, the last data byte is encoded first and fed to a buffer wherein the buffer address is noted. When the first data byte (last written) is encountered, the address can be noted again. The calculation of the length is end minus start as the end address (or index) is greater than the start address (or index).

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

BRIEF DESCRIPTION OF THE DRAWINGS

In the drawings:

FIG. 3 is a block diagram of a system implementing the present invention;

DETAILED DESCRIPTION OF THE PREFERRED EMBODIMENTS

Figure 1:
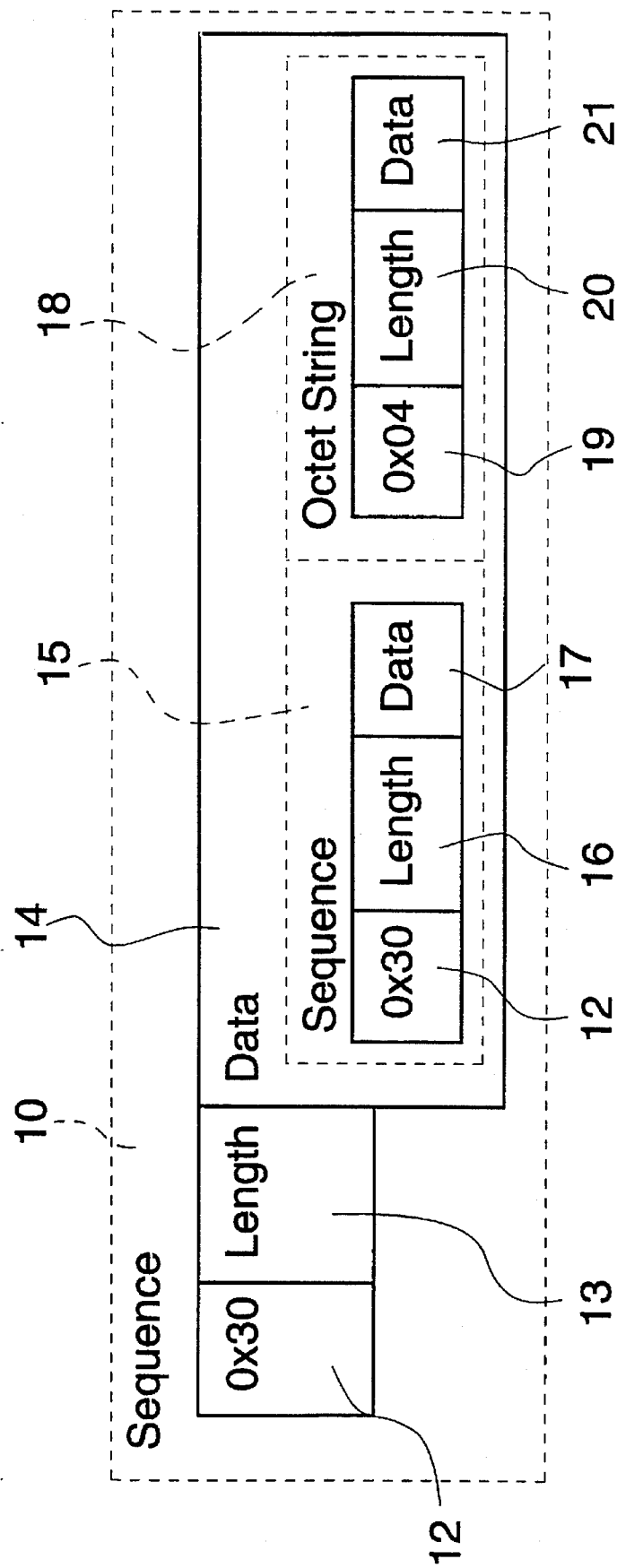
FIG. 1 is a schematic view showing an encoded set of datum of the ASN.1 including a sequence and an octet and a sequence within the sequence.

Referring to the drawings in particular, the invention provides a system and method for encoding a set of datum according to the basic encoding rules of the Abstract Syntax Notation 1 as defined by ISO 8824 and CCITT X.208.

FIG. 1 is a schematic showing of an ASN.1 encoding. The encoding is a value in the form of a sequence 10 or other data type however a sequence such as sequence 10 is of primary interest according To the invention. For example, a sequence might contain several levels of data type (e.g. nested sequences; octet strings etc.) with each sequence containing many values. The figure shows a sequence 15 and an octet string 18 encoded within the sequence 10. Both of the sequences have a type field 12 that contains the identifier for a sequence 0-30 or Hex 30. The octet string has a type field 19 that contains the identifier for an octet string 4. All values (sequences, octet strings and other data types) contain a length field. That is the sequence 10 has a length field 13, the sequence 15 has a length field 16 and the octet string 18 has a length field 20. The sequence 10 has a data section 14 (which includes the sequence 15 as well as the octet string 18). The sequence 15 has a data section 17 and the octet string 18 has a data section 21. The length fields 13, 16 and 20 will require one or more bytes depending on how many bytes are required to encode the number of bytes that follow the length in the data sections 14, 17, 21 of the value. The length field 14 of the outer sequence 10 in this example will reflect the total number of bytes required to encode both inner sequence 15 as well as the octet string 18. Since both of these values have variable length fields recursive calculation of length before encoding has been required unless the method and system of the invention are employed. That is, a given length field may include as few as one byte and as many as three or four bytes, depending on the size of the value. In the past, algorithms could only represent the length in the fewest number of bytes by looking ahead (two pass method). The invention provides for the encoded data to be read into a buffer backwards, namely building the buffer backwards wherein the length of the value is known when the length is being encoded in the buffer.

The start and end of a structured data type (set or sequence) has been referred to herein with the first byte of the structured data type being the start and the last byte being the end. According to the invention, the first byte is encoded and/or written last and the last byte is written first, as further discussed herein.

Figure 2:
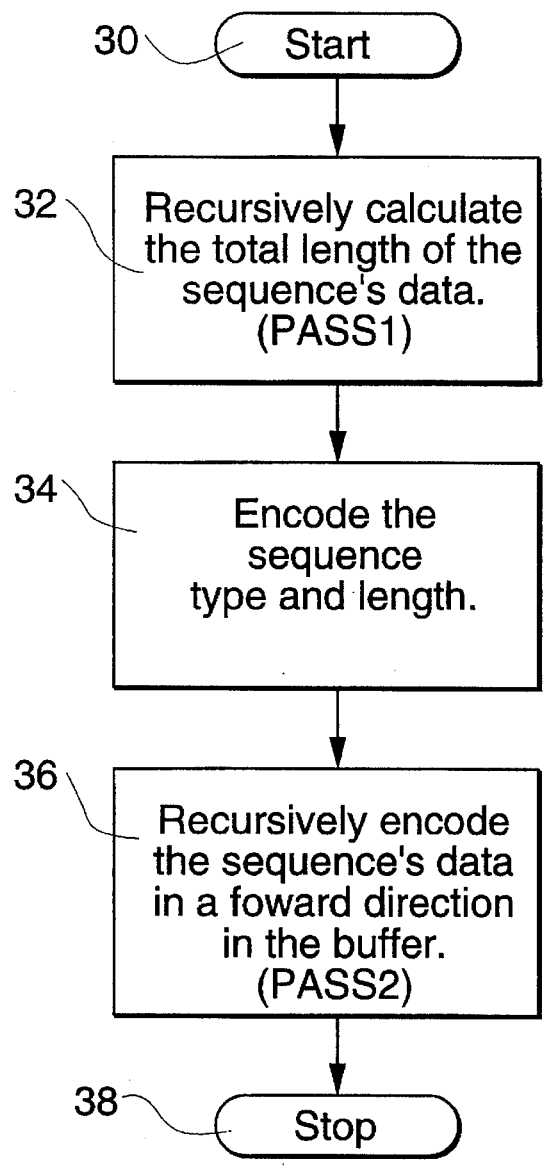
FIG. 2 is a simplified flow chart of a process for encoding data according to the BER and ASN.1 as defined by ISO 8824 and CCITT X.208.

FIG. 2 shows a simplified flow chart of encoding an ASN.1 sequence. The encoding is started at 30 and at step 32 a pass of all data is required to calculate the length of each value (type, length and data). The sum of all value lengths in a sequence becomes the length of the data in the sequence. Once the total data length of the sequence is known, the sequence type and length can be encoded at step 34. A second pass of the data is then required at 36 to encode the data of the sequence. The procedure is stopped at 38, after the data is encoded. Most implementations will retain the individual data lengths calculated in order to expedite the encoding during the second pass. However, two passes of the data will still be required. If the sequence contains other sequences, this algorithm must be executed recursively. Other encoding systems are known such as that of the U.S. Pat. No. 5,375,204 to Motoyama et al. (which is hereby incorporated by referenced). However, as noted above, this does not achieve the optimum encoding length.

FIG. 3 shows a block diagram of the system implementing the present invention. The user of the invention accesses the mechanism via an application program interface (API) 40. A stream of values and/or a notation of containment structure boundaries is pushed at 42 onto a stack 44. Once the stack 44 has been loaded the ASN.1 encoder 48 pops value entries at 46 from the stack in reverse order, namely in an order which is the reverse of the direction of the stream of value/or notations fed at 42. For example, considering the sequence 10, this entails feeding the notation of containment structure boundary and values starting from the right side as schematically depicted in FIG. 1. Using the stack 44, this may be accomplished by a simple first in last out procedure. As each end of containment structure boundary is encountered, the current address in the encoding buffer 64 is placed at 50 on a stack of buffer addresses 52. This marks the end of such structures in the buffer. As each value is encountered, it is encoded and written into the buffer 64 in a reverse direction. As each of the beginning of containment structure boundaries 15 encountered, the structures ending address is popped off the buffer address stack 52 and the current buffer 64. The size of the containment structure is determined based on the difference between these values, namely the difference between the structures beginning address and the current buffer, to form a length. The length and the containment structures type are written to the buffer.

FIG. 3 provides a showing of the system wherein the buffer is composed of individual memory units 64 that are managed at 62 by a memory management unit (MMU) 60 of a CPU (central processing unit). As a new buffer is created or as the buffer 64 expands beyond the start of a currently allocated buffer space, a page fault will occur. The MMU 60 responds to a page fault by allocating at 56 a block of free memory 54 and placing this free memory 54 in the address space preceding the previous buffer start. While using this technique, the buffer can continue to grow backwards in memory to accommodate a large encoding as it is built. Once the entire buffer has been constructed it can be forwarded at 66 to the appropriate transport 70.

Accordingly, with single pass encoding is the algorithm must estimate the total buffer size to avoid copying the data when the buffer is to be expanded. By implementing an expanding stack algorithm that expands the stack when a page fault is detected, as noted above (reference to an element of the buffer that is before the 0th index), this issue can be avoided and performance can be further improved.

Figure 4:
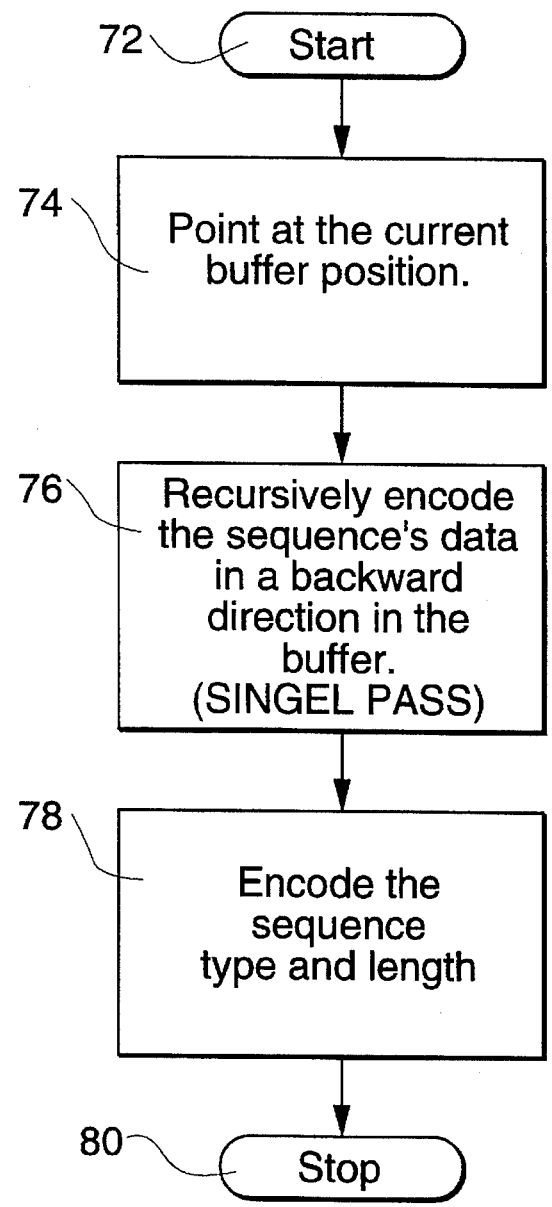
FIG. 4 is a flow chart illustrating the process of the procedure according to the invention.

FIG. 4 shows a simplified flow chart for encoding the ASN.1 sequence using the invention. After start at 72 the current point in the buffer is retained at 74 for calculating the length in step 78. In the second step labeled 76, a pass is made of the sequences data. This involves encoding each value in reverse order into the buffer (entering it into the buffer backwards). If the sequences data contains sequences, the algorithm is called recursively at that point. Once the data has been encoded, the type and the length of the sequence at hand can be encoded as noted at 78. The length of the sequence is the difference the pointer established previously at step 74 (the end of the sequence) and the pointer to the current position in the buffer (the start of the sequences data). Only one pass of the data is required as the length of the data is written to the buffer after the data has been encoded. The procedure ends as noted at 80 (stop).

The invention allows ASN.1 encoding to be implemented in hardware in view of the reduced complexity for the ASN.1 encoding. This is particularly important in network management agents that process many ASN.1 encodings.

The system and method of the invention can be applied to other data encoding methods besides ASN.1. Methods which require two pass encodings because of length calculations can practice the system and method of this invention. However, in many protocols, the length calculation is not an issue as the length may be represented as fixed length values. However, wherein the length is a variable and wherein it is necessary to use a compressed length notation, the system of the invention provides significant benefits.

While a specific embodiment of the invention has been shown and described in detail to illustrate the application of the principles of the invention, it will be understood that the invention may be embodied otherwise without departing from such principles.

What is claimed is:

1. A method for encoding data values, each encoded value including a type portion, a length portion and a data portion, comprising the steps of:

encoding each data value into an encoded portion in a binary format;

writing the encoded portion in reverse order by first writing a last encoded portion into an end position of the data portion;

noting an ending index, upon starting said step of writing and noting starting index upon ending said step of writing; and determining a length of said data portion based on a difference between said starting index and said ending index.

2. A method according to claim 1, wherein said step of encoding each data value comprises using a stack to push all data values on said stack and encoding individual data values read off said stack according to a first in last out procedure.

3. A method according to claim 1, wherein said step of writing includes writing encoded data to a buffer wherein an address of a last byte, written first, is noted and an address of a first byte, written last is also noted to determine said length of said data portion.

4. A method according to claim 2, further comprising implementing an expanding stack algorithm for expanding a stack when a page fault is detected in writing encoded data to a buffer.

5. A method of encoding a set of datum according to the basic encoding rules of the Abstract Syntax Notation 1 (ASN.1) as defined by ISO 8824 and CCITT X.208, the set of datum once encoded including a data type, a data length and a data value, the data length not being known prior to encoding, the method comprising the steps of:

encoding each data value into a binary format by using a stack to push all data values on said stack and encoding individual data values read off said stack according to a first in last out procedure whereby an end data value is encoded first and a beginning of the data value is encoded last;

writing the encoded data in reverse order to a buffer by first writing the value data portion by writing the end of the encoded data to the buffer first;

noting an ending index, upon starting said step of writing and noting an starting index upon ending said step of writing;

determining a length of said data portion based on a difference between said starting index and said ending index; and encoding said length of said data portion.

6. An apparatus for encoding a set of datum according to the basic encoding rules of the Abstract Syntac Notation 1 as defined by ISO 8824 and CCITT X.208, comprising:

means for encoding structured data by encoding an end of the structured data first and encoding a start of the data last;

writing means for first writing said end of the encoded data into a buffer;

buffer address means for noting the buffer address of the last byte, written first and the first byte written last and for determining a length of said data portion based on said start address and end address.

7. An apparatus according to claim 6, further comprising: a stack, data values being pushed on said stack and read off said stack according to a first in last out procedure, said means for encoding each data value receiving an end of the data value for encoding first and receiving the start of the data value for encoding last.

8. An apparatus in accordance with claim 6, wherein:

said buffer has an end position and a beginning position:

said writing means writes the encoded data from said end to said start of the encoded data, and into said buffer from said end position to said starting position of said buffer.

9. An apparatus in accordance with claim 6, wherein:

said writing means writes said length of said data portion immediately ahead of a last encoded data written to said buffer.

10. A method in accordance with claim 1, wherein:

said writing in reverse order includes writing a next to last data value into said data portion immediately ahead of a last data value written to said data portion.

11. A method in accordance with claim 1, wherein:

said writing in reverse order includes writing from an end to a start of the data values, and into said data portion from said end position to a start position.

12. A method in accordance with claim 1, wherein:

said length is written into the encoded value immediately ahead of a last data value written to said data portion.

13. A method for encoding comprising the steps of:

providing a sequence of data, said sequence including a starting index positioned at a beginning of said sequence, including an ending index positioned at an end of said sequence, and including one value between said starting index and said ending index;

reading said sequence;

recording a position of said ending index;

encoding said value into an encoded value;

writing said encoded value into an encoded word starting from an end position of said encoded word toward a start position of said encoded word;

recording a position of said starting index;

calculating a length of said encoded value from said positions of said beginning index and said end index writing said length into said encoded word directly ahead of said encoded value.

14. A method in accordance with claim 13, wherein:

said writing includes writing from an end to a start of said encoded value and into said encoded word from said end position to a start position.

15. A method in accordance with claim 13, wherein:

said reading of said sequence is performed sequentially in reverse order from said ending index to said starting index;

said encoding of said value is performed as said value is read from said sequence.

16. A method in accordance with claim 13, wherein:

a buffer is provided having an end position and a beginning position:

said encoded value is written into said buffer from said end position toward said beginning position;

said buffer has a size to hold a plurality of encoded values.

17. A method in accordance with claim 13, wherein:

said encoded word is transported in a direction from said start position to said end position.

18. A method in accordance with claim 13, wherein:

said value of said sequence includes another sequence with another starting index, another value and another ending index, said another sequence being processed similarly to said sequence to form another encoded word;

said encoded word being said encoded value for said one of said first and second values.

19. A method for encoding comprising the steps of:

providing a sequence of data, said sequence including a starting index positioned at a beginning of said sequence, including an ending index positioned at an end of said sequence, and including a first value positioned adjacent said starting index and including a second value positioned adjacent said ending index;

reading said sequence;

recording a position of said ending index;

encoding said second value into a second encoded value;

writing said second encoded value into an a buffer;

encoding said first value into a first encoded value;

writing said first encoded value into said buffer after said writing of said second encoded value and directly ahead of said second encoded value;

recording a position of said starting index;

calculating a length of said first and second encoded values from said positions of said starting index and said ending index;

writing said length into said buffer directly ahead of said first encoded value to form an encode word.

\* \* \* \* \*